US007267742B2

(12) United States Patent
Okuchi et al.

(10) Patent No.: US 7,267,742 B2
(45) Date of Patent: Sep. 11, 2007

(54) ETCHING APPARATUS, A METHOD OF CONTROLLING AN ETCHING SOLUTION, AND A METHOD OF MANUFACTURING A SEMICONDUCTOR DEVICE

(75) Inventors: Hisashi Okuchi, Yokohama (JP); Hiroyasu Iimori, Yokohama (JP); Mami Saito, Yokohama (JP); Yoshihiro Ogawa, Yokohama (JP); Hiroshi Tomita, Yokohama (JP); Soichi Nadahara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 10/922,905

(22) Filed: Aug. 23, 2004

(65) Prior Publication Data

US 2005/0230045 A1   Oct. 20, 2005

(30) Foreign Application Priority Data

Apr. 20, 2004  (JP) .......................... P2004-124070

(51) Int. Cl.
*C23F 1/00* (2006.01)
*H01L 21/306* (2006.01)

(52) U.S. Cl. .............. 156/345.1; 156/345.11; 156/345.15; 156/345.17; 156/345.18; 156/345.24

(58) Field of Classification Search ............... None
See application file for complete search history.

(56) References Cited

U.S. PATENT DOCUMENTS 6,001,215 A * 12/1999 Ban ...................... 156/345.15

6,645,876 B2    11/2003 Saito et al. .................. 438/745
2006/0151112 A1*  7/2006 Yoshida et al. ........ 156/345.15

FOREIGN PATENT DOCUMENTS

| JP | 6-333898 | 12/1994 |
| JP | 11-154666 | 6/1999 |
| JP | 2002-246378 | 8/2002 |
| JP | 2003-158111 | 5/2003 |
| JP | 2004-319568 | 11/2004 |

OTHER PUBLICATIONS

Notification of Reasons for Refusal issued by the Japanese Patent Office dated May 16, 2006, for Japanese Patent Application No. 2004-124070, and English-language translation thereof.
Notification of Reasons for Refusal issued by the Japanese Patent Office dated May 15, 2007, for Japanese Patent Application No. 2004-124070, and English-language translation thereof.

* cited by examiner

*Primary Examiner*—Duy-Vu N Deo
(74) *Attorney, Agent, or Firm*—Finnegan, Henderson, Farabow, Garrett & Dunner, L.L.P.

(57) ABSTRACT

An etching apparatus includes a chamber containing an etching solution including first and second components and water, a concentration of the water in the etching solution is at a specified level or lower; a circulation path circulating the etching solution; a concentration controller sampling the etching liquid from the circulation path and controls concentrations of the etching solution respectively; and a refilling chemical liquid feeder feeding a refilling chemical liquid including the first component having a concentration higher than the first component in the etching solution.

8 Claims, 12 Drawing Sheets ness of sulfuric acid and water under constant conditions. In other words, the SPM is a concentration controlling apparatus for refilling new hydrogen peroxide when the hydrogen peroxide in the solution is reduced by being dissolved in water. Thus, the water content in the solution increases as hydrogen peroxide is refilled. Accordingly, the water content cannot be kept at 5 wt %, and the concentration of sulfuric acid also deviates. If an attempt is made to maintain the concentration of sulfuric acid at a certain level by using the SPM, a large quantity of sulfuric acid should be added to the solution in order to suppress an increase of water due to dissolution of hydrogen peroxide into water, and thus costs for chemical liquids are increased.

ETCHING APPARATUS, A METHOD OF CONTROLLING AN ETCHING SOLUTION, AND A METHOD OF MANUFACTURING A SEMICONDUCTOR DEVICE

CROSS REFERENCE TO RELATED APPLICATIONS

This application is based upon and claims the benefit of priority from the prior Japanese Patent Applications No. P2004-124070, filed on Apr. 20, 2004; the entire contents of which are incorporated herein by reference.

BACKGROUND OF THE INVENTION

1. Field of the Invention

The present invention relates to a semiconductor device, more specifically to an etching apparatus suitable for controlling the concentration of an etching solution, a method of controlling the concentration of the etching solution, and a method of manufacturing a semiconductor device using the etching apparatus.

2. Description of the Related Art

A semiconductor manufacturing process using an etching solution containing sulfuric acid ($H_2SO_4$) and hydrogen fluoride (HF) as main components has been proposed as a process of etching of films having differing qualities on the surface of a semiconductor substrate. In the process, it is important to maintain the etching solution at low water content, and an initial water concentration is regulated to be at 5 wt % or lower. However, when a treatment chamber is used for a batch treatment method, it is basically open to the atmosphere. Consequently, the concentration of sulfuric acid in the solution is gradually reduced due to moisture absorption by sulfuric acid from the ambient atmosphere. Moisture absorption by sulfuric acid changes the state of dissociation equilibrium of an etchant contained in the solution, and the etching rates and selective etching ratio of intended etched films thus deviate from the initial states thereof by a large extent.

In order to prevent moisture absorption of sulfuric acid, there is a method of purging the ambient atmosphere of the treatment chamber with a bulk gas such as nitrogen ($N_2$). However, it is almost impossible to create a fully sealed state after a certain level, by sulfuric acid cannot be completely suppressed. Hence, etching rates change. Consequently, in order to remove the intended etched films selectively, treatment time for the etched films should be adjusted, or process control should be examined with changes in etching rates taken into consideration in advance. Thereupon, there is a method, which has been examined, to control the concentration of sulfuric acid by means of suppressing an increase of water due to moisture absorption by sulfuric acid. This method is done by spiking highly-concentrated sulfuric acid when the concentration of sulfuric acid is decreased.

However, as for the semiconductor manufacturing process using an etching solution containing sulfuric acid and HF as main components, not only sulfuric acid but also HF, as an etchant, gradually evaporate. Hence, it is difficult to control the etching characteristics of the etching solution so that the etching characteristics are invariable.

Currently, apparatuses capable of controlling the concentration of sulfuric acid in the solution include a sulfuric acid-hydrogen peroxide aqueous solution monitor (SPM), an ammonia-hydrogen peroxide aqueous solution monitor (SC1), and a hydrochloric acid-hydrogen peroxide aqueous solution monitor (SC2). However, the SPM is used for the purpose of keeping the concentration of hydrogen peroxide constant. Thus, it is difficult to keep the concentrations of sulfuric acid and water under constant conditions. In other words, the SPM is a concentration controlling apparatus for refilling new hydrogen peroxide when the hydrogen peroxide in the solution is reduced by being dissolved in water. Thus, the water content in the solution increases as hydrogen peroxide is refilled. Accordingly, the water content cannot be kept at 5 wt %, and the concentration of sulfuric acid also deviates. If an attempt is made to maintain the concentration of sulfuric acid at a certain level by using the SPM, a large quantity of sulfuric acid should be added to the solution in order to suppress an increase of water due to dissolution of hydrogen peroxide into water, and thus costs for chemical liquids are increased.

Further, as for the SC1 and the SC2, quantities of hydrochloric acid or ammonia should be added to the solution in order to attenuate the dissolution of hydrogen peroxide into water. Thus, quantities of the chemical liquids should be refilled for maintaining the concentrations of both water and sulfuric acid at a certain level.

SUMMARY OF THE INVENTION

An aspect of the present invention inheres in an etching apparatus comprising: a chamber containing an etching solution including a first component, a second component, and water, a concentration of the water in the etching solution is at a specified level or lower; a circulation path configured to circulate the etching solution; a concentration controller configured to sample the etching liquid from the circulation path and control concentrations of the first and second components and water respectively; and a refilling chemical liquid feeder configured to feed a refilling chemical liquid including the first component having a concentration higher than the first component in the etching solution.

Another aspect of the present invention inheres in a method of controlling etching solution comprising: feeding an etching solution including a first component, a second component, and water, a concentration of the water in the etching solution is at a specified level or lower; circulating the etching solution; controlling the concentrations of the first and second components and water respectively; and feeding a refilling chemical liquid including the first component having a concentration higher than the first component in the etching solution.

Still another aspect of the present invention inheres in a method of manufacturing a semiconductor device comprising: forming a thin film on a substrate; feeding the substrate in an etching solution including a first component, a second component, and water, a concentration of the water is at a specified level or lower; circulating the etching solution; controlling the concentrations of the first and second components and water respectively; and feeding a refilling chemical liquid including the first component having a concentration higher than the first component in the etching solution.

DETAILED DESCRIPTION OF THE INVENTION

Figure 1:
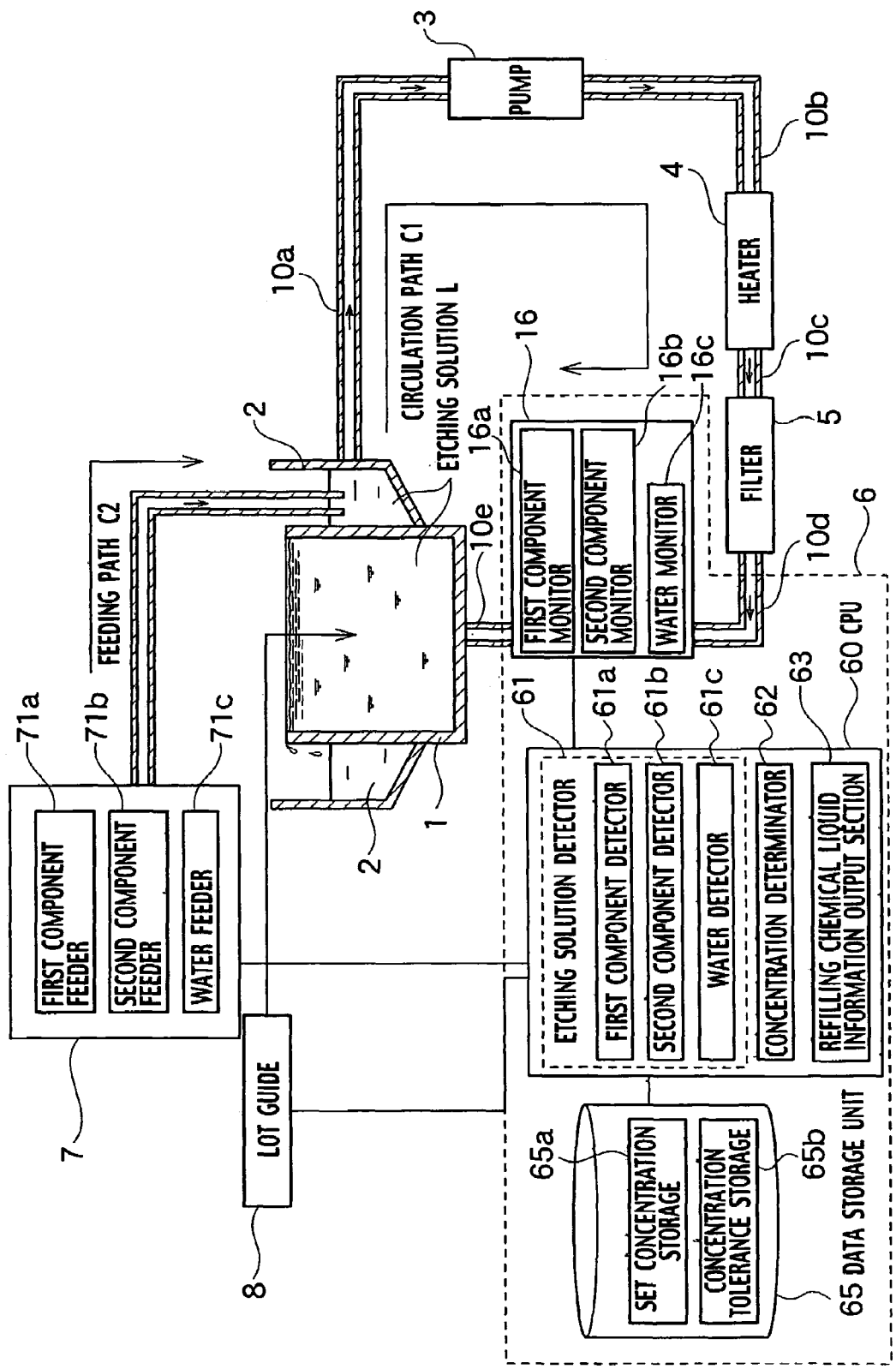
FIG. 1 is a block diagram showing an etching apparatus according to the embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. However, it will be obvious to those skilled in the art that the present invention may be practiced without such specific details.

<Etching Apparatus>

As shown in FIG. 1, an etching apparatus according to an embodiment of the present invention includes a treatment chamber 1 which contains an etching solution L containing a first component, a second component, and water and having a water concentration at a specified level or lower, a circulation path C1 circulating the etching solution L, a concentration controller 6 sampling the etching liquid L from the circulation path C1 and controlling the respective concentrations of the first and second components, and a refilling chemical liquid feeder 7 feeding a refilling chemical liquid containing the first component with the concentration higher than that of the first component in the etching solution L to the treatment chamber 1. Thereinafter, "refilling chemical liquid" refers to a liquid used for refilling the etching solution L.

The treatment chamber 1 is a chamber suitable for immersing a lot consisting of a plurality of semiconductor wafers into the etching liquid L as one batch. A lot guide 8 is connected to the top of the treatment chamber 1 for guiding the lot into the treatment chamber 1. By the etching solution L contained in the treatment chamber 1, insulating films deposited on the semiconductor wafers can be selectively etched. These insulating films include a thermal oxide film (Th—$SiO_2$ film), a tetraethoxysilane film (TEOS film), a borosilicate glass film (BSG film), a boro-phospho-silicate glass film (BPSG film), a phosphosilicate glass film (PSG film), a silicon nitride film ($Si_3N_4$ film), a silicon oxynitride film (SiON film) and the like. For example, suitable etching solution L for etching at a selective etching ratio of BSG film and $SiO_2$ film of 100 or higher, is a hydrogen fluoride/sulfuric acid/water based (HF/$H_2SO_4$/$H_2O$ based) solution containing 94.0 to 97.5 wt % of sulfuric acid as the first component, 0.5 to 2.0 wt % of hydrogen fluoride as the second component, and 2.0 to 4.0 wt % of water.

The top of the treatment chamber 1 is open to the atmosphere, and an external chamber 2 is disposed encompassing the treatment chamber 1. The etching solution L contained in the treatment chamber 1 that overflows from the top of the treatment chamber 1 is to be contained in the external chamber 2. The circulation path C1 for circulating the etching solution L and supplying the etching solution L again from the bottom of the treatment chamber 1 is connected to the downstream side of the outer chamber 2. The circulation path C1 has a pump 3 whose sucking side is connected to a duct 10a connected to the downstream side of the external chamber 2. The pump 3 sucks the etching solution L within the external chamber 2 into the circulation path C1. On the discharging side of the pump 3, a heater 4 is connected. The heater 4 heats the etching solution L supplied from a duct 10b. A filter 5 is connected on the downstream side of the heater 4 through a duct 10c. The filter 5 filters the etching solution L supplied from the side of a duct 10c. A monitoring section 16 of the concentration controller 6 is connected to the downstream side of the filter 5 through a duct 10d. The downstream side of the monitoring section 16 is connected to a duct 10e. The downstream side of the duct 10e is connected to the bottom of the treatment chamber 1. Note that, although not illustrated, a duct for discharging part of the etching solution L may be connected to the monitoring section 16.

The concentration controller 6 controls the concentration of the etching solution L so that the concentration is maintained within a certain range so that the concentration of the same is optimized in accordance with the selective etching ratio of the intended etched films. The concentration controller 6 includes the monitoring section 16 which monitors the concentration of the etching solution L supplied to the circulation path C1, a process control unit (CPU) 60 connected to the monitoring section 16 and controlling the concentration of the etching solution L, and a data storage unit 65 connected to the CPU 60.

The monitoring section 16 monitors the concentration of each component contained in the etching solution L. As shown in FIG. 1, the monitoring section 16 has, for example, a first component monitor 16a, a second component monitor 16b, and a water monitor 16c. The first component monitor 16a monitors the concentration of the first component in the etching solution L supplied from the duct 10d. The second component monitor 16b monitors the concentration of the second component in the etching solution L supplied from the duct 10d. The water monitor 16c monitors the concentration of water in the etching solution L supplied from the duct 10d. The concentration controller 6, capable of monitoring a solution containing multiple components as shown in the monitoring section 16 in FIG. 1, is generally a concentration controller that converts an absorbance spectrum of each kind of chemical liquid into the concentration of the chemical liquid. However, a method of concentration conversion may not be limited thereto. FIG. 1 shows an example in which the first component, the second component and water are monitored by different monitors, respectively. However, a concentration monitor capable of respectively and simultaneously monitoring the first component, the second component and water may naturally be employed.

The CPU 60 controls the monitoring section 16, and causes the concentration controller 6 to control the concentration of the etching solution L contained in the treatment chamber 1. The CPU 60 includes an etching solution detector 61 detecting the concentration of the etching solution L monitored by the monitoring section 16, a concentration determinator 62 determining whether or not the concentration of the etching solution L satisfies a reference concentration value, and a refilling chemical liquid information output section 63 outputting refilling chemical liquid information for supplying a chemical liquid to be refilled in the etching liquid L, to the treatment chamber 1.

The etching solution detector 61 has a first component detector 61a, a second component detector 61b, and a water detector 61c. The first component detector 61a detects concentration information, such as the absorbance spectrum, of the first component monitored by the first component monitor 16a. The second component detector 61b detects concentration information, such as the absorbance spectrum, of the second component monitored by the second component monitor 16b. The water detector 61c detects concentration information, such as the absorbance spectrum, of the water monitored by the water monitor 16c.

The concentration determinator 62 compares the concentration of the first component, second component and water contained in the etching solution L, detected by the etching solution detector 61, to the set concentrations and concentration tolerances inputted in advance. The concentration determinator 62 then determines whether or not a refilling chemical liquid should be fed to the treatment chamber 1. Based on the resulting determination by the concentration determinator 62, the refilling chemical liquid information output section 63 extracts refilling chemical liquid information required for supplying the refilling chemical liquid of the etching solution L to the treatment chamber 1, and then outputs the information to the refilling chemical liquid feeder 7. The data storage unit 65 has a set concentration storage 65a storing set concentration of the etching solution L contained in the treatment chamber 1, and a concentration tolerance storage 65b storing concentration tolerance for controlling the concentration of the etching solution L in the treatment chamber 1 so that the concentration is maintained within a certain range.

For example, when an $HF/H_2SO_4/H_2O$ based solution is used as the etching solution L, the set concentration storage 65a stores set values of the concentrations of sulfuric acid as the first component, hydrogen fluoride as the second component, and water. The concentration tolerance storage 65b stores a concentration tolerance of sulfuric acid as the concentration tolerance of the first component, and a concentration tolerance of hydrogen fluoride as the concentration tolerance of the second component and a concentration tolerance of water.

Figure 2:
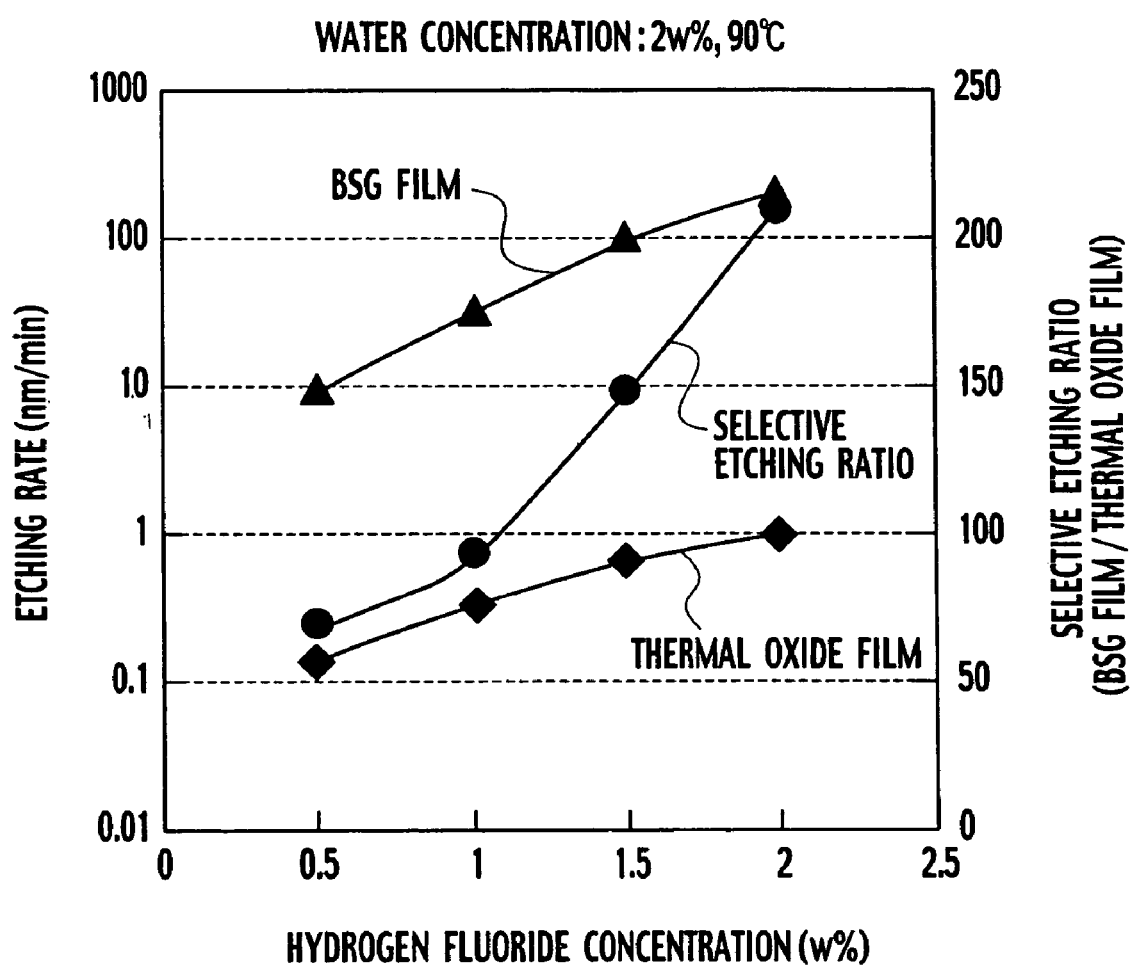
FIGS. 2 and 3 show examples of changes in the etching rates of a BSG film and a thermal oxide film, and the selective etching ratio of the BSG film and the thermal oxide film.

FIG. 2 shows examples of changes in the etching rates of a BSG film and thermal oxide film relative to the concentration of hydrogen fluoride, as well as an example of a change in the selective etching ratio of the BSG film relative to the thermal oxide film, when the BSG film and thermal oxide film are etched using an $HF/H_2SO_4/H_2O$ based solution as the etching solution L. In FIG. 2, the etching solution L is warmed to 90° C. and the water concentration is fixed at 2 wt %. According to FIG. 2, when the concentration of hydrogen fluoride is 0.5 wt % or higher, the etching rates of both the BSG film and the thermal oxide film are increased. For example, when the concentration of hydrogen fluoride is increased from 0.5 wt % to 2.0 wt %, the etching rates of both the BSG film and the thermal oxide film are increased by approximately ten times. On the other hand, where the concentration of hydrogen fluoride is 0.5 wt % or lower, the etching rates are decreased. As a result, treatment requires a longer period of time, and thus productivity is reduced. In the examples shown in FIG. 2, therefore, it is agreeable that the concentration of hydrogen fluoride contained in the etching solution L is at 0.5 wt % or higher.

As for the selective etching ratio of the BSG film relative to the thermal oxide film, the selective etching ratio in FIG. 2 is approximately 70 when the concentration of hydrogen fluoride is at 0.5 wt %, but increases to approximately 100 when the concentration of hydrogen fluoride is at 1.0 wt % and to approximately 200 when the concentration of hydrogen fluoride is at 2.0 wt %. It is preferred that the selective etching ratio be controlled so that the ratio is maintained at 100 or higher in order to efficiently and promptly remove the desired BSG film and thermal oxide film deposited on a semiconductor wafer. Therefore, in the example shown in FIG. 2, the concentration controller 6 controls the concentration of hydrogen fluoride (the first component) so that the concentration is maintained preferably at 0.5 to 2.0 wt %, and more preferably at 0.9+/−0.1 wt % when the BSG film and thermal oxide film are etched using an $HF/H_2SO_4/H_2O$ based solution as the etching solution L. By controlling the tolerance of hydrogen fluoride so that it is maintained at 0.9 wt %+/−0.1 wt %, the period of time required for treatment with a concentration of hydrogen fluoride at 0.5 wt % can be reduced from about 100 minutes to about 50 minutes, when removing the BSG film.

Figure 3:
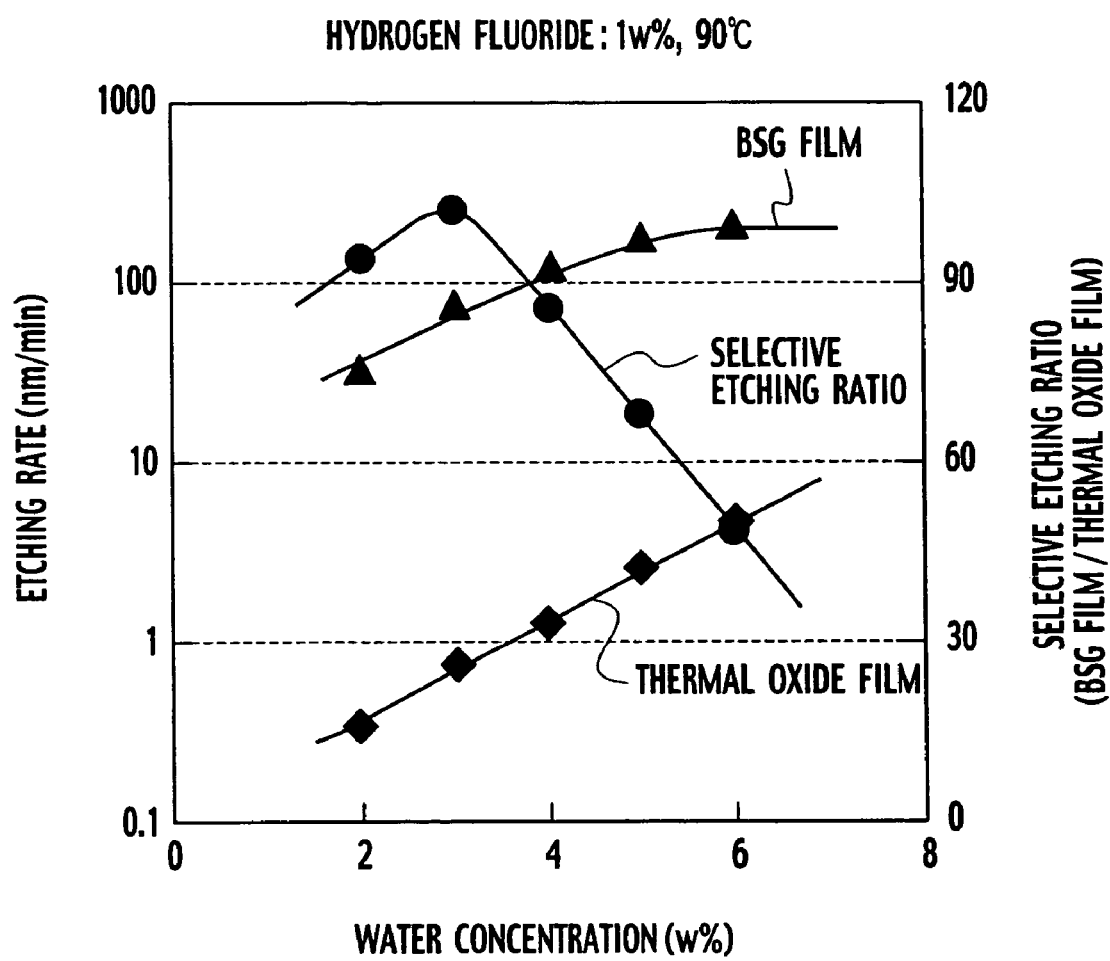

FIG. 3 shows examples of changes in the etching rates of BSG film and thermal oxide film relative to the concentration of water, and an example of a change in the selective etching ratio of the BSG film relative to the thermal oxide film, when an $HF/H_2SO_4/H_2O$ based solution is used as the etching solution L. FIG. 3 shows a result of warming the etching solution L to 90° C. and fixing the concentration of hydrogen fluoride at 1 wt %. As shown in FIG. 3, when the water concentration is 2 wt % or higher, the etching rates of both BSG film and thermal oxide film are higher. Meanwhile, the selective etching ratio of the BSG film relative to the thermal oxide film is 100 or thereabout when the water concentration is 2 to 4 wt %. However, the selective etching ratio gradually decreases to about 70 when the water concentration is 5 wt %, and to about 50 when the water concentration is 6 wt %. In the example shown in FIG. 3, the concentration controller 6 controls the water concentration so that the concentration is maintained at 4 wt % or lower, or at 2 to 4 wt %, and more preferably at 3.00+/−0.03 wt %.

As shown in FIG. 1, the refilling chemical liquid feeder 7 feeds a refilling chemical liquid to the treatment chamber 1 based on the refilling chemical liquid information outputted by the refilling chemical liquid information output section 63. The refilling chemical liquid feeder 7 has a first component feeder 71a feeding a refilling chemical liquid containing the first component of the etching solution L, a second component feeder 71b supplying a refilling chemical liquid containing the second component of the etching solution L, and a water feeder 71c supplying water.

The first component feeder 71a contains, for example, a refilling chemical liquid containing the first component at a concentration higher than that of the first component in the etching solution L. For example, when the sulfuric acid is the first component of the etching solution L poured into the treatment chamber 1 and the concentration of the sulfuric acid is approximately 96 wt %, the refilling chemical liquid of the first component is preferably concentrated sulfuric acid having a concentration at about 98 wt % and water concentration is 2 wt % or lower. When the second component is hydrogen fluoride, it is preferred that the second component feeder 71b contains hydrofluoric acid or a mixed solution of $HF/H_2SO_4$, whose water concentration is 4 wt % or lower, preferably 2 wt % or lower. By using concentrated sulfuric acid, hydrofluoric acid or a mixed solution of $HF/H_2SO_4$, with the water concentration of 2 wt % or lower, the concentrations of the sulfuric acid and hydrogen fluoride can be controlled while maintaining the water concentration of the etching solution L at a low level.

As shown in FIG. 1, the refilling chemical liquid feeder 7 is connected to the external chamber 2 through a feeding path C2 connected to the downstream side of the refilling chemical liquid feeder 7. The feeding path C2 includes a first component feeding line for feeding the first component, a second component feeding line for feeding the second component, and a water feeding line for feeding water. The feeding path C2 may include a mixing line for mixing the first and second components and the water in advance, thus forming the etching solution L, and for feeding the solution to the external chamber 2.

The following will be further evident from an etching solution control method descried later. With the etching apparatus according to the embodiment, the concentration controller 6 connected to the circulation path C1 controls the concentrations of the first component, the second component, and the water in the etching solution L contained in the treatment chamber 1, so that the concentrations fall within certain ranges, respectively. For example, when an $HF/H_2SO_4/H_2O$ based solution is used as the etching solution L, BSG film and thermal oxide film are etched in a short period of time in a preferable selective etching ratio, by setting the range of the concentration of sulfuric acid (the first component) from 94.0 to 97.5 wt % as its concentration tolerance, by setting the range of the concentration of hydrogen fluoride (the second component) from 0.5 to 2.0 wt % as its concentration tolerance, and by setting the range of water concentration from 2.0 to 4.0 wt % as its concentration tolerance.

Further, the etching apparatus according to the embodiment feeds a refilling chemical liquid which contains the first or second component at concentration higher than that of the first or second component in the etching solution L within the treatment chamber 1, and in which the water concentration is at 4 wt % or lower. Since the water concentration of the etching solution L does not increase due to the supply of the refilling chemical liquid, the concentrations of the first and second components can be controlled by adding small amounts of the refilling chemical liquids. It is not necessary to replace the whole etching solution L at the end of each lot treatment, whereby the life of the etching solution L can be greatly improved.

Figure 4:
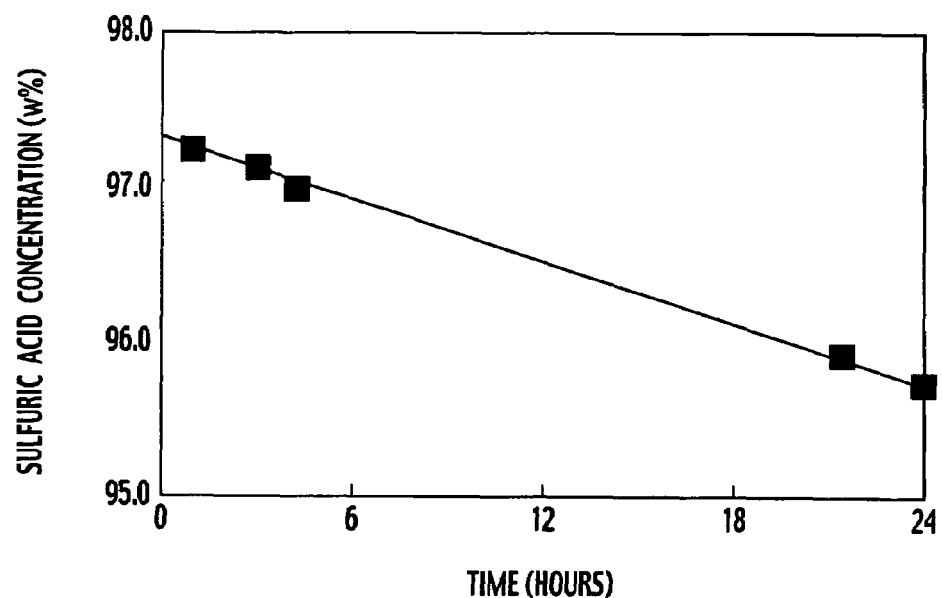
FIG. 4 shows an example of a change in the concentration of sulfuric acid when the concentrations are not controlled.
Figure 5:
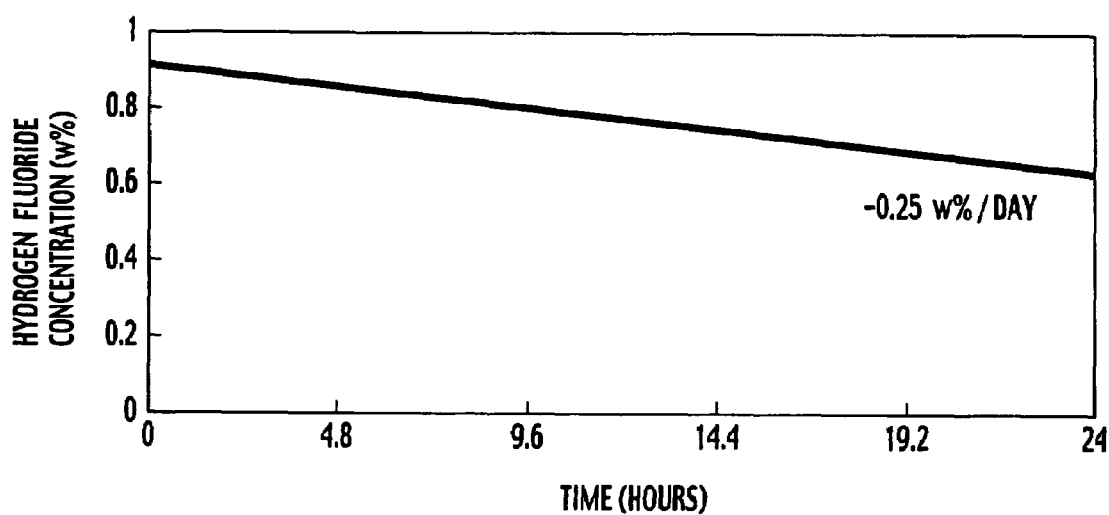
FIG. 5 shows an example of a change in the concentration of hydrogen fluoride when the concentrations are not controlled.
Figure 6:
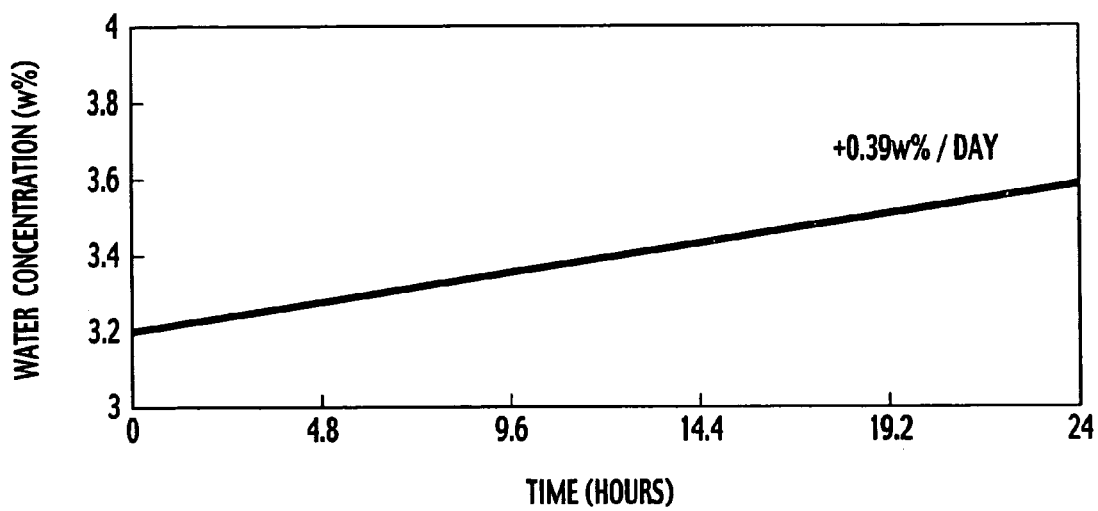
FIG. 6 shows an example of a change in the concentration of water when the concentrations are not controlled.

FIGS. 4 to 6 show examples of changes in the concentrations of the respective components in the etching solution L when the concentrations are not controlled. FIG. 4 shows an example of a change in the concentration of sulfuric acid when an $HF/H_2SO_4/H_2O$ based solution is open to the atmosphere. In the example in FIG. 4, the concentration of sulfuric acid in the solution is diluted due to absorption of moisture in the atmosphere, and reduced by about 1.5 wt % in a day. FIG. 5 shows an example focusing on a change in the concentration of hydrogen fluoride when an $HF/H_2SO_4/H_2O$ based solution having a concentration different from that of FIG. 4 is open to the atmosphere. According to the example shown in FIG. 5, the concentration of hydrogen fluoride in the etching solution L is reduced by about 0.25 wt % in a day due to absorption of moisture in the atmosphere. FIG. 6 shows an example focusing on a change in the concentration of water when an $HF/H_2SO_4/H_2O$ based solution having a concentration different from those of FIGS. 4 and 5, is open to the atmosphere. In the example shown in FIG. 6, the water concentration in the solution is increased by about 0.39 wt % in a day due to absorption of moisture in the atmosphere. Accordingly, when the concentrations are not controlled for the $HF/H_2SO_4/H_2O$ based solution, the concentrations of sulfuric acid and hydrogen fluoride are reduced, and the water concentration increases as time elapses.

Figure 7:
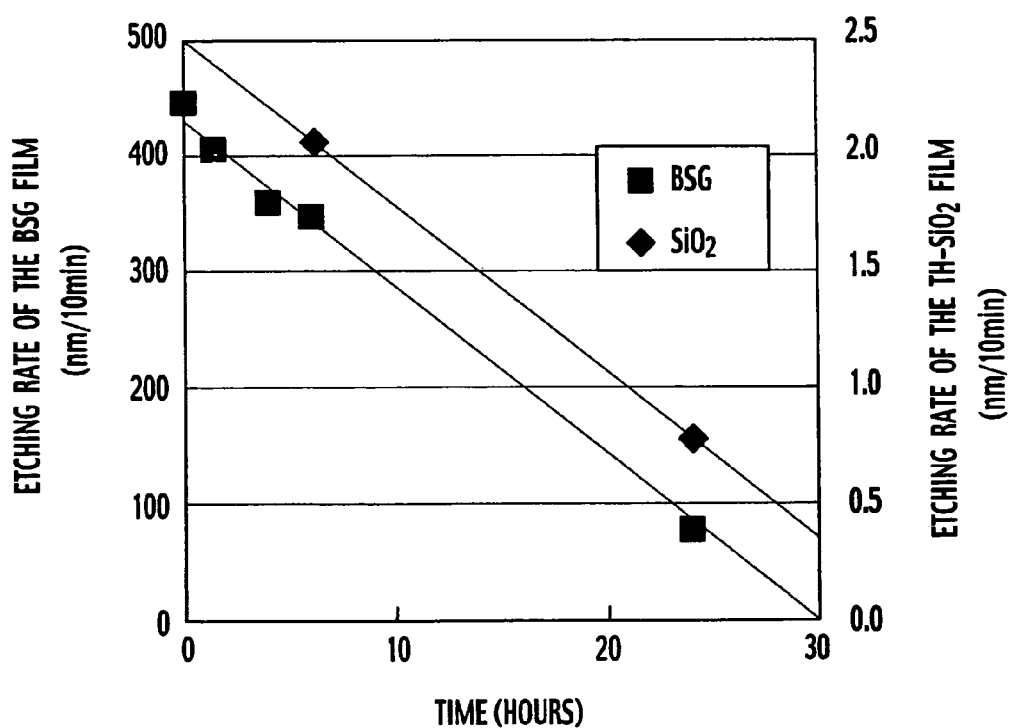
FIG. 7 shows changes of the etching rates of the BSG film and the thermal oxide film when the concentrations are not controlled.

FIG. 7 shows an example of etching rate of the BSG film in a generally used etching apparatus without the concentration controller 6. In the example of FIG. 7, when the concentrations of sulfuric acid and hydrogen fluoride in the etching solution L are not controlled, the concentrations are reduced as time elapses, and the etching rate of the BSG film is reduced to be about one fifth in a day. The etching rate of the thermal oxide film is reduced to be about one third in a day.

Figure 8:
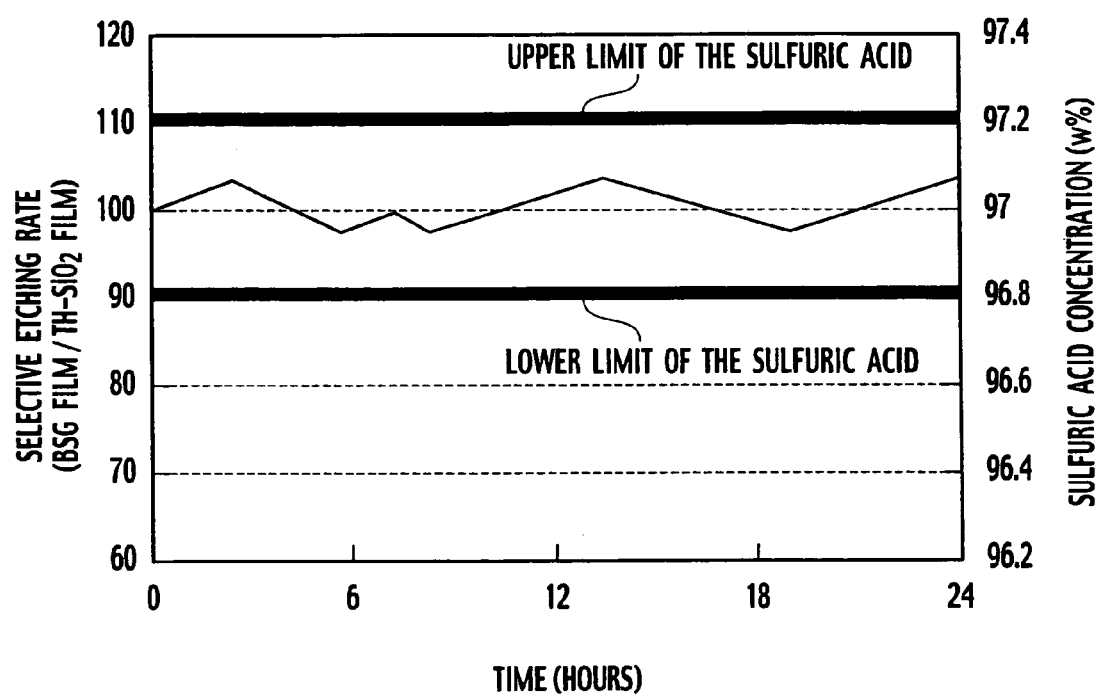
FIG. 8 shows an example of changes of the selective etching rate and the sulfuric acid concentration according to the embodiment of the present invention.

On the other hand, FIG. 8 shows an example in which the concentrations are controlled by using the etching apparatus according to the embodiment. FIG. 8 shows an example of a selective etching ratio of a BSG film relative to a thermal oxide film in a case that an $HF/H_2SO_4/H_2O$ based solution is used as the etching solution L, and that the concentration controller 6 controls the lower limit of the sulfuric acid concentration so that that lower limit is maintained at 96.8 wt % and the upper limit of the same so that the upper limit is maintained at 97.2 wt %. As evident from FIG. 8, by controlling the concentration of the sulfuric acid in the etching solution L so that the concentration is always maintained within a constant range (in this case, the concentration of the sulfuric acid ranges from 96.8 to 97.2 wt %), the selective etching ratio can be controlled so that the ratio is maintained within a certain range, including, and around 100. Therefore, according to the embodiment, it is possible to provide an etching apparatus capable of controlling etching, characteristics so that the etching characteristics are maintained under certain conditions.

Further, in order to maintain etching characteristics under preferable conditions when an $HF/H_2SO_4/H_2O$ based solution is used, it is necessary to maintain the water concentration at a low level. Therefore, in the etching apparatus according to the embodiment, by using concentrated sulfuric acid and anhydrous hydrofluoric acid, which contain a smaller amount of water, as the refilling chemical liquids of the first component and the second component, respectively, and by refilling the etching solution L with the acids, the concentrations of sulfuric acid and hydrogen fluoride can be adjusted to preferable conditions while maintaining the water concentration at a low level. An etching apparatus capable of stably controlling etching characteristics, therefore, can be provided. It is not necessary to replace the whole etching solution L for each lot treatment, and the etching treatment can be performed continuously. Thus, the life of the etching solution can be greatly extended.

<First Method of Controlling an Etching Solution>

Figure 9:
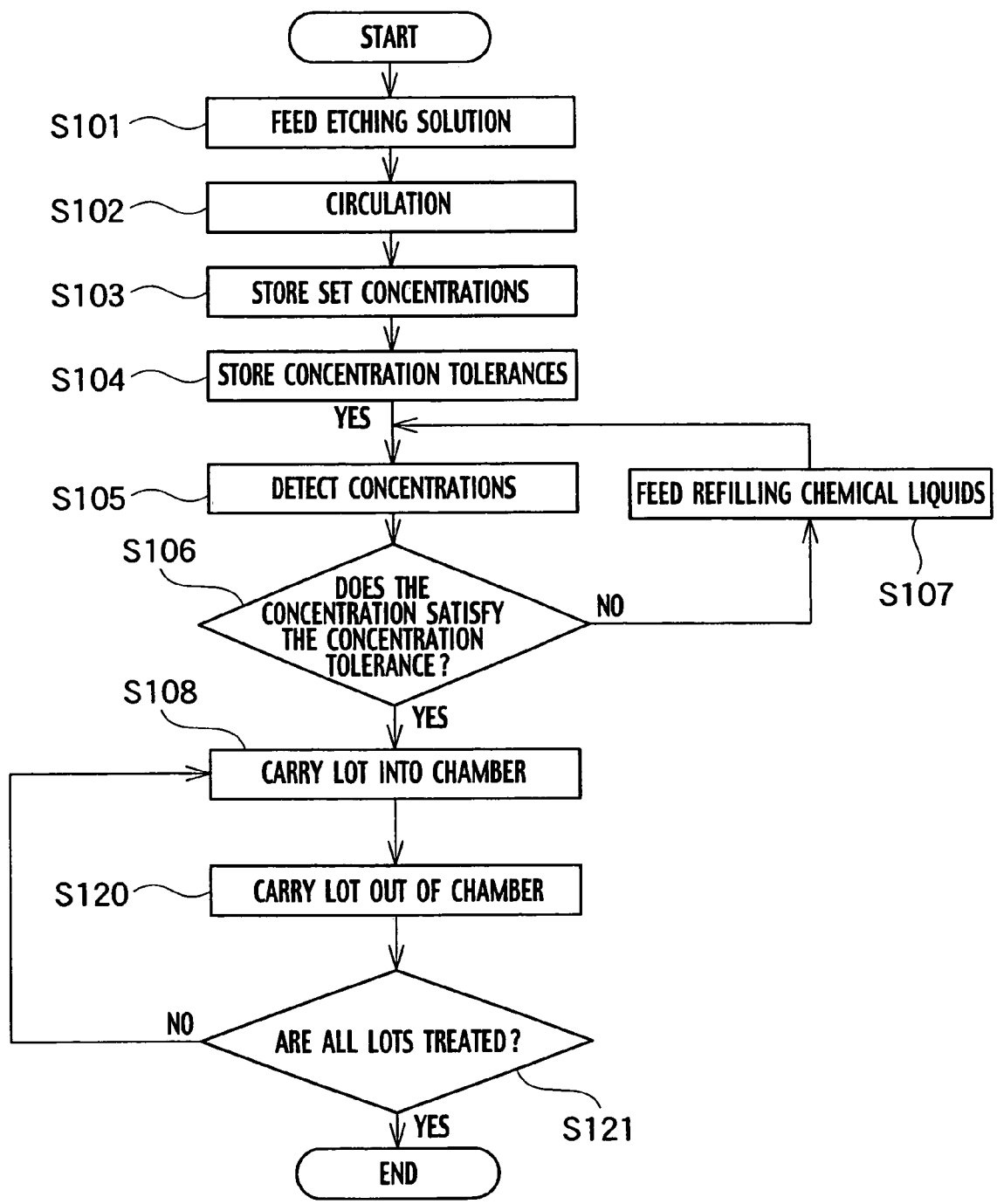
FIG. 9 is a flowchart showing a first method of controlling the concentration of an etching solution according to the embodiment of the present invention.

The first method of controlling an etching solution according to the embodiment is described with reference to the flowchart shown in FIG. 9. Note that the method described below is one example and the order of each operation can of course be changed when deemed appropriate.

(a) In step S101, an initial etching solution L is fed to the treatment chamber 1. The initial etching solution L contained in the chamber is preferably an $HF/H_2SO_4/H_2O$ based solution containing, for example, 94 to 96.5 wt % of sulfuric acid (the first component), 1.0 to 2.0 wt % of hydrogen fluoride (the second component) and 2.5 to 3.5 wt % of water. The etching solution L is fed to an extent that the solution overflows from the top of the treatment chamber 1, and that the solution L is fed into the external chamber 2.

(b) In step S102, the etching solution L fed to the external chamber 2 is supplied to the circulation path C1 using the pump 3, and is circulated. The etching solution L supplied to the circulation path C1 passes through the ducts 10a and 10b, and is heated by the heater 4. The etching solution L then passes through the duct 10c, and is rid of contaminants at the filter 5. The etching solution L after removal of contaminants passes through the duct 10d, the monitoring section 16 and the duct 10e, and returns to the treatment chamber 1 entering it from the bottom. At this time, the first component monitor 16a of the monitoring section 16 monitors the concentration of the first component (sulfuric acid) of the etching solution L. The second component monitor 16b monitors the concentration of the second component (hydrogen fluoride) of the etching solution L. The water monitor 16c monitors the water concentration of the etching solution L. The concentration of the etching solution L is continuously monitored by the monitoring section 16 while the etching solution L circulates within the apparatus.

(c) In step S103, the set concentrations of the first component, the second component, and water of the etching solution L are stored. The set concentrations can be appropriately set depending on the kind of etching solution L and the kinds of films to be etched. However, where an $HF/H_2SO_4/H_2O$ based solution is used as the etching solution L, the concentrations of sulfuric acid serving as the first component, hydrogen fluoride serving as the second component, and water, can be set at 96 wt %, at 1.0 wt % and at 3 wt %, respectively.

(d) In step S104, the concentration tolerance of the etching solution L is stored. For example, when an $H_2SO_4/H_2O$ based solution is used for etching under the condition that the selective etching ratio of the etching rate of a BSG film to that of a thermal oxide film is 100 or higher, by storing a value "+/−0.2 wt %", for example, as the concentration tolerance of the first component (sulfuric acid), the concentration controller 6 can control the concentration of sulfuric acid so that the concentration is maintained within a range from 95.8 to 96.2 wt %. As for the concentration tolerance of the second component (hydrogen fluoride), by storing a value "+/−0.1 wt %," for example, the concentration controller 6 can adjust the concentration of hydrogen fluoride so that the concentration is maintained within a range of 1.0+/−0.1 wt %. As for the concentration tolerance of water, by storing a value "+/−0.03 wt %", for example, the concentration controller 6 can adjust the water concentration so that the concentration is maintained within a range of 3.0+/−0.03 wt %. Note that the timing of storing the set concentrations and concentration tolerances described above in steps S103 and S104 is not particularly limited, and the set concentrations and concentration tolerances may be stored in advance, before the etching solution L is poured into the chamber in the step S101.

(e) In step 105, the first component detector 61a, the second component detector 61b, and the water detector 61c respectively detect information regarding the concentrations of the first component (sulfuric acid), the second component (hydrogen fluoride), and water in the etching solution L, which are monitored by the first component monitor 16a the second component monitor 16b and the water monitor 16c, respectively. In step S106, the concentration determinator 62 determines whether or not the concentrations, detected by the first component detector 61a, the second component detector 61b, and water detector 61c, satisfy the concentration tolerances stored in the concentration tolerance storage 65b. If none of the concentrations of the first component (sulfuric acid) the second component (hydrogen fluoride) and water satisfy the corresponding component tolerances, the process proceeds to step S107. When all concentration tolerances are satisfied, the process proceeds to step S108.

(f) In step 107, based of the resulting determination by the concentration determinator 62, the refilling chemical liquid information output section 63 outputs information of the refilling chemical liquids for the refilling liquid chemical feeder 7 to refill the etching solution L. For example, when the concentration determinator 62 determines that the first component does not satisfy the concentration tolerance, the refilling chemical liquid information output section 63 outputs information for refilling the first component, to the first component feeder 71a. Subsequently, the first component feeder 71a refills the external chamber 2 with a refilling chemical liquid containing the first component at a concentration higher than that of the first component contained in the etching solution L, to the external chamber 2 through the feeding path C2. In a case that the etching solution L contains sulfuric acid as the first component at the concentration of 96 wt %, a solution containing 98 wt % of sulfuric acid and 2 wt % of water (concentrated sulfuric acid) may be used as the refilling chemical liquid. The refilled concentrated sulfuric acid is circulated through the circulation path C1 together with the etching solution L.

(g) In step 108, the lot guide 8 guides a lot including a plurality of semiconductor wafers guided into the lot guide 8, into the treatment chamber 1. Part of the etching solution L within the treatment chamber 1 overflow into the external chamber 2 from the top of the treatment chamber 1, and are supplied to the circulation path C1. After the etching treatment is finished in the treatment chamber 1, the treated lot is carried out of the treatment chamber 1 in step S120. In step S121, where all the lots are treated, the etching treatment ends. On the other hand, where there remains a lot to be treated, the lot guide 8 guides the lot into the treatment chamber 1 in step S108, and the etching treatment is performed.

According to the first etching solution control method according to the embodiment, the concentration of the etching solution L in the course of the etching treatment of a lot in the treatment chamber 1 is controlled so that the concentration is maintained within a certain range by the concentration controller 6. The etching treatment, therefore, can be performed while the concentration of the etching solution L is constantly monitored. Thus, the selective etching ratio of the intended etched films is controlled so that the ratio is maintained within a certain range (see FIG. 8) Further, a refilling chemical liquid is fed which contains the first component (sulfuric acid) at a concentration higher than that of the first component contained in the etching solution L, and water at a reference concentration or lower. Thus, the concentrations of the first and second components of the etching solution L can be controlled while maintaining the water concentration in the etching solution L at a low level. As a result, etching can be performed while maintaining a high selective etching ratio.

<Second Method of Controlling an Etching Solution>

Figure 10:
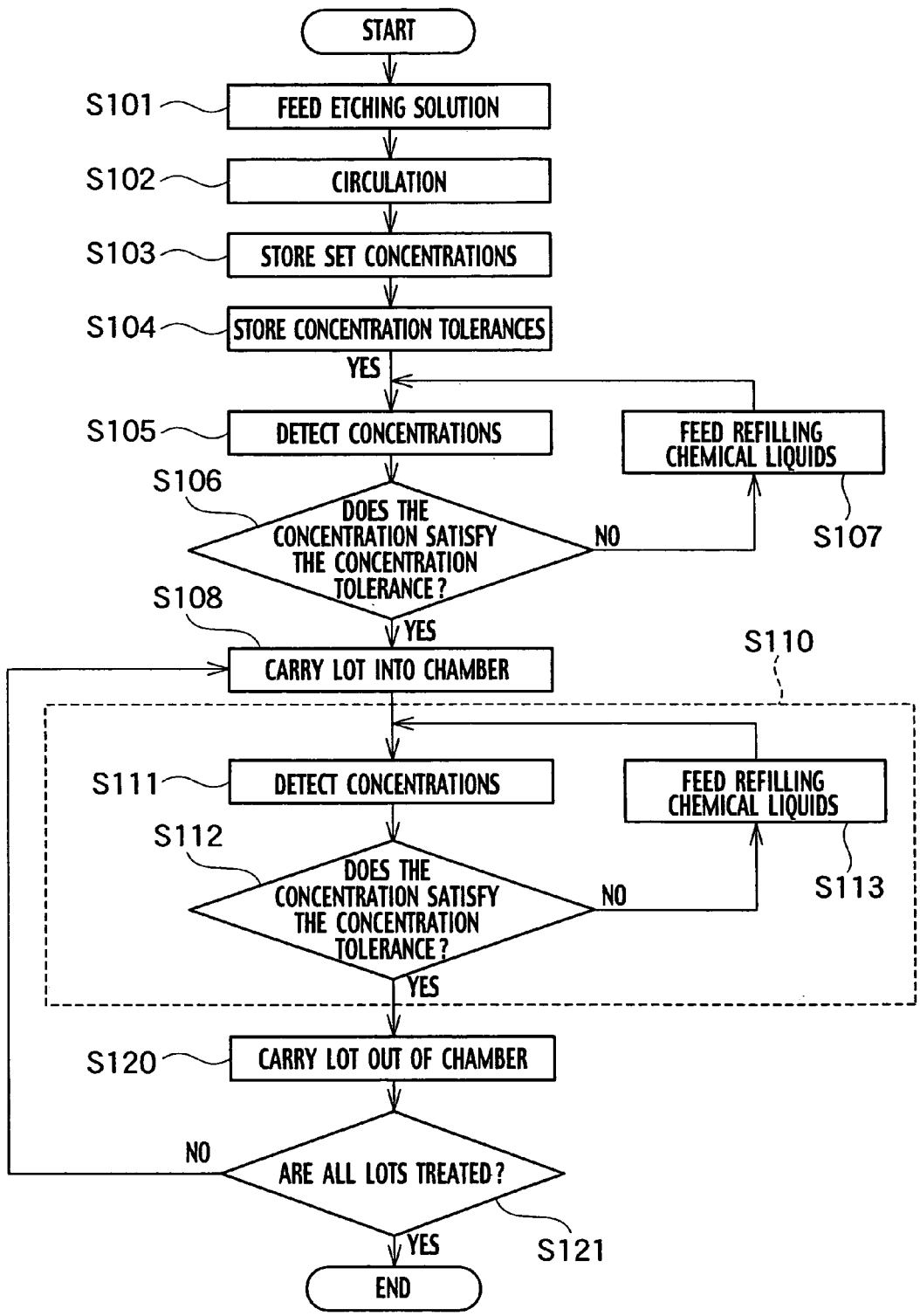
FIG. 10 is a flowchart showing a second method of controlling the concentration of the etching solution according to the embodiment of the present invention.

A second method of controlling an etching solution using the etching apparatus of the embodiment is described with reference to the flowchart shown in FIG. 10. Note that steps S101 to S108 and steps S120 to S121 shown in FIG. 10 are substantially the same as those of the etching solution control method shown in FIG. 9, and description thereof is thus omitted.

(p) In step S110, while a lot is guided into the treatment chamber 1 and the etching treatment is performed, the concentration controller 6 controls the concentration of the etching solution L so that the concentration is constant. In step S111, the first component monitor 16a, the second component monitor 16b, and the water monitor 16c monitor the concentrations of sulfuric acid, hydrogen fluoride, and water in the etching solution L, respectively, while the first component detector 61a, the second component detector 61b, and the water detector 61c detect information regarding the concentrations of sulfuric acid, hydrogen fluoride, and water, respectively.

(q) Next, in step S112, the concentration determinator 62 determines whether or not the concentrations, detected by the first component detector 61a, the second component detector 61b, and the water detector 61c, satisfy the concentration tolerances stored in the concentration tolerance storage 65b. If none of the detected concentrations satisfy the corresponding concentration tolerances, the process proceeds to step S113, where the refilling chemical liquid feeder 7 feeds a refilling chemical liquid such as a first component solution (sulfuric acid), a second component solution (hydrogen fluoride), water or the like, based on refilling chemical liquid information outputted from the refilling chemical liquid information output section 63. When all the concentration tolerances are satisfied, no refilling chemical liquid is fed and the monitoring of the concentrations continues. The monitoring described in step S110 continues until the lot is carried out.

According to the second etching solution control method according to the embodiment, the concentration of the etching solution L is always controlled so that the concentration is maintained within a certain range by the concentration controller 6, while the etching treatment is performed in the treatment chamber 1. When the concentration of the etching solution L changes in the course of the etching treatment, the concentration thereof can be adjusted by the concentration controller 6 to a preferable concentration ratio, and thus a selective etching ratio of the intended etched films is controlled.

<Method of Manufacturing a Semiconductor Device>

Figure 11:
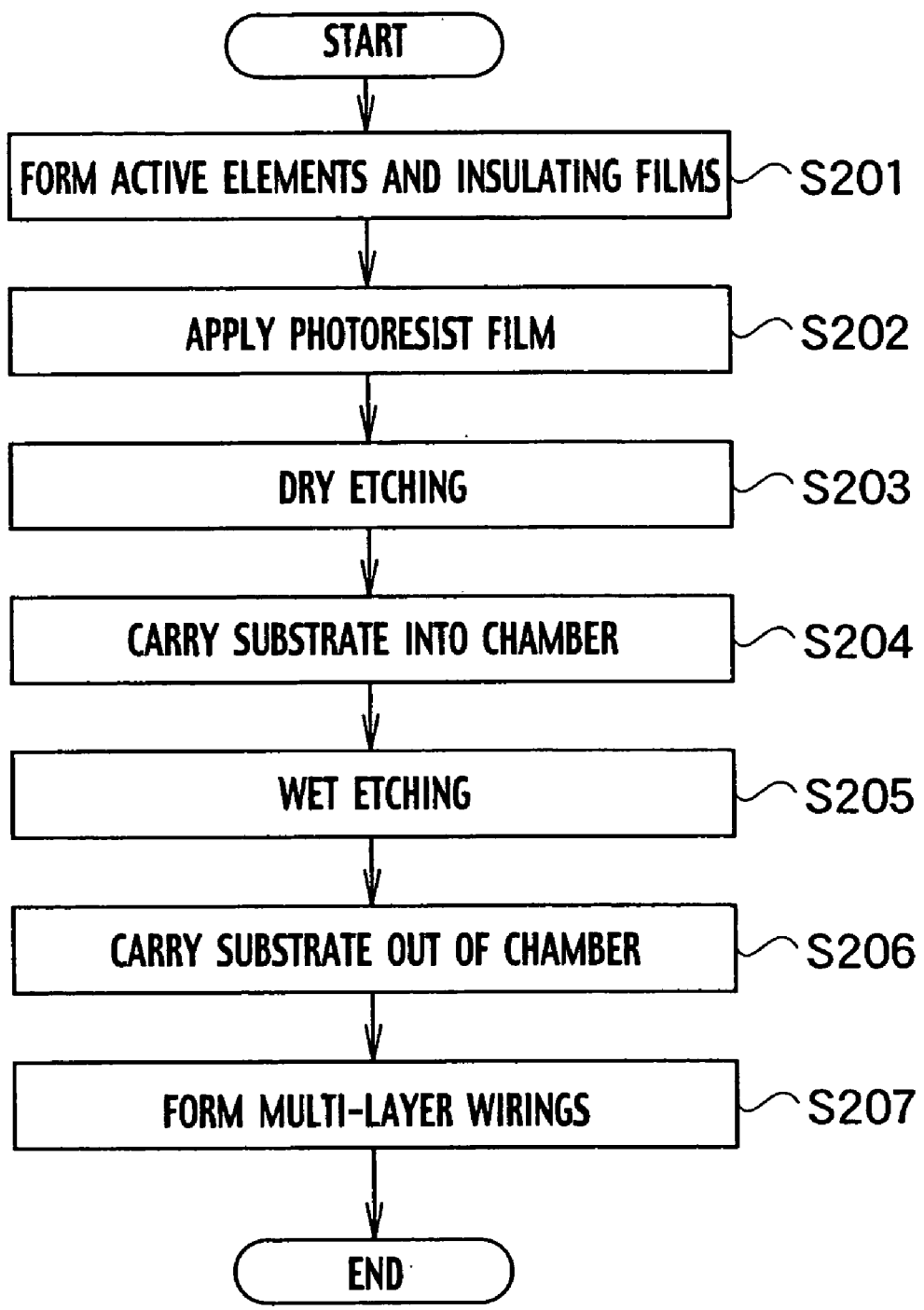
FIG. 11 is a flowchart showing a method of manufacturing a semiconductor device according to the embodiment of the present invention.

Referring to FIG. 11, a method of manufacturing a semiconductor device according to the embodiment is provided. In the following method, nMOS transistors are described as an example of active elements of the semiconductor device. However, the following method can be applied to many other manufacturing methods of semiconductor devices and electronic devices.

(a) In step 201, after boron ($B^+$) is ion-implanted into a semiconductor substrate, which is an n-type silicon wafer, heat treatment (thermal diffusion) is performed to form p-wells. Next, the semiconductor substrate is partially delineated so that isolation grooves are formed on the substrate, and isolation layers are embedded in the isolation grooves by chemical vapor deposition (CVD) or the like. The surface of the semiconductor substrate is thermally oxidized so that gate oxide film is formed on the substrate, and polysilicon gate electrodes are formed on the gate oxide film by the CVD and other etching processes. By using the polysilicon gate electrodes as masks, phosphorus is ion-implanted in an aligning fashion to the semiconductor substrate. Thereafter, heat treatment is performed so that main electrodes (source/drain regions) are formed in the p-wells. Subsequently, a first insulating film is deposited on the surface of the semiconductor substrate by the CVD.

(b) In step S202, a photoresist film is deposited on the surface of the first isolation film by a lithographic process. In step 203, using the photoresist film as a mask, the first isolation film is dry-etched so that grooves for wiring formation are formed. In addition, contact holes, which follow the grooves and extend to the main electrodes, are opened by the dry etching. At this time, residues remain on the surfaces of the grooves and contact holes.

(c) In step S204, the semiconductor substrate in which the grooves and contact holes are formed is carried into the treatment chamber 1 shown in FIG. 1, and residues remaining on the surfaces of the grooves and contact holes are removed. While etching is performed, the concentration controller 6 controls the concentrations of the first component, the second component and water in the etching solution L so that the concentrations are maintained at certain levels respectively as shown in steps S110 in FIG. 10, for example. In step S111, the monitoring section 16 monitors the respective concentrations of the first component, the second component, and water in the etching solution L circulated through the circulation path C1. The etching solution detector 61 detects the concentrations of the first component, the second component and water.

(d) In step S112 in FIG. 10, the concentration determinator 62 determines whether or not each concentration detected by the etching solution detector 61 satisfies the corresponding set concentration and concentration tolerance stored in the concentration tolerance storage 65b. If none of the detected concentrations satisfy the corresponding concentration tolerances, the process proceeds to step S113, where the refilling chemical liquid feeder 7 adds a refilling chemical liquid such as a first component solution, a second component solution, or water, based on refilling chemical liquid information outputted by the refilling chemical liquid information output section 63. When all the concentration tolerances are satisfied, no refilling chemical liquid is fed, and the monitoring of the concentrations continues. The monitoring shown in step S110 continues until the semiconductor substrate is taken out.

(e) In step 206 in FIG. 11, the semiconductor substrate is carried out of the treatment chamber 1. Thereafter, in step S207, copper (Cu) is embedded, by plating or the like, inside the grooves and contact holes formed in the semiconductor substrate. The surface of the first insulating film is treated by chemical mechanical polishing (CMP), and a wiring layer is formed in step S207. As described above, multi-layer wiring is formed by repeating the formation of wiring, the etching, the formation of via and contact, and the formation of a wiring layer, and thus the semiconductor device is completed.

According to the method of manufacturing the semiconductor device of the embodiment, the concentration of the etching solution L is controlled so that the concentration is maintained within a certain range when etching a plurality of insulating films which have been formed on the semiconductor substrate. Thus, a desired film, residues and the like can be removed in a short period of time while maintaining the selective etching ratio of the etching rates at a high level.

FIRST MODIFICATION OF THE EMBODIMENT

Figure 12:
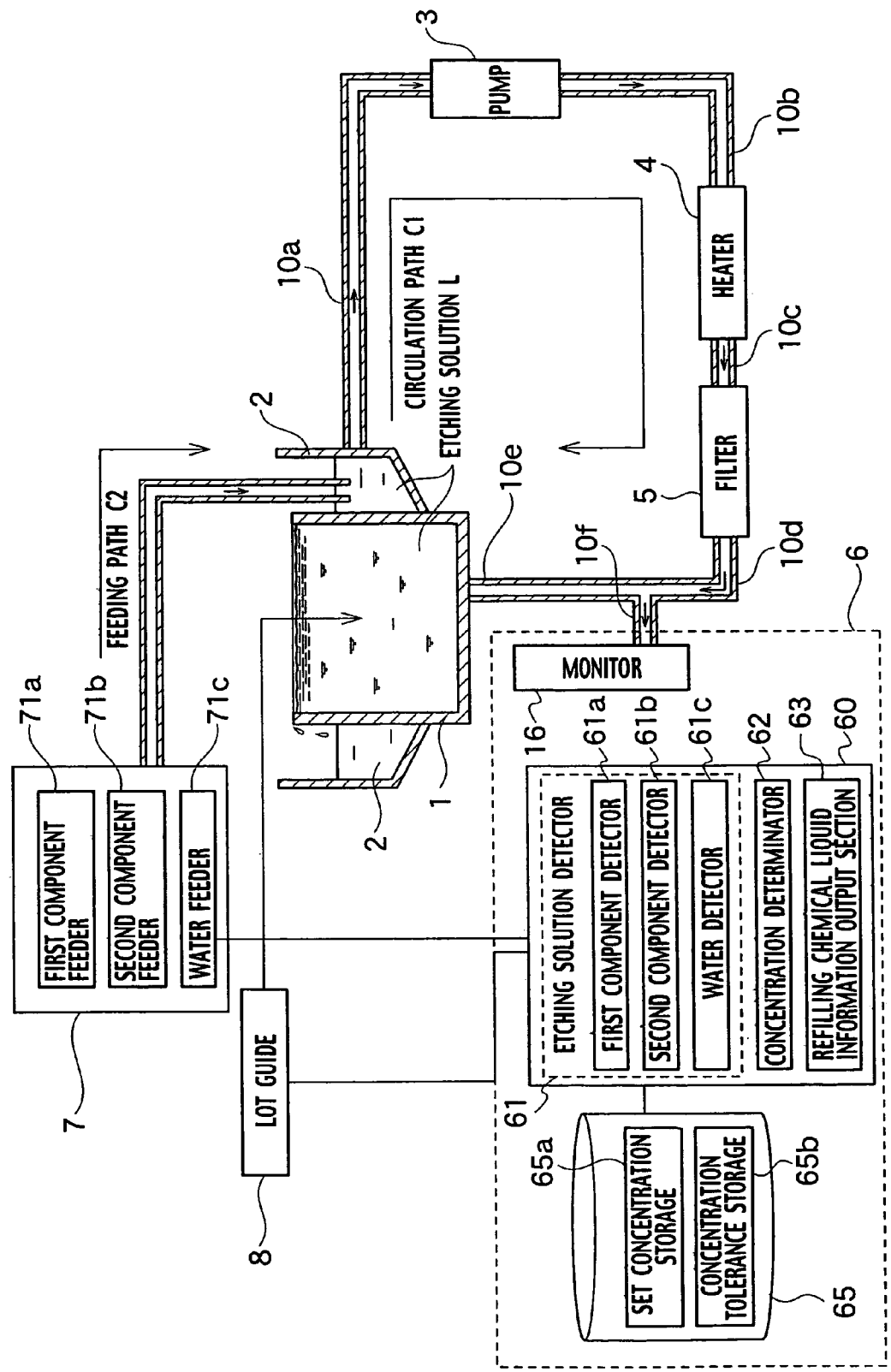
FIG. 12 is a block diagram showing an etching apparatus according to a first modification of the embodiment.

As shown in FIG. 12, in the etching apparatus according to the first modification of the embodiment of the present invention, the monitoring section 16 of the concentration controller 6 is connected to the downstream side of a duct 10f branched off in the place connecting the ducts 10d and 10e. According to the first modification of the embodiment, part of etching solution L running through the ducts 10d and 10e of the circulation path C1 can be sampled.

SECOND MODIFICATION OF THE EMBODIMENT

<Etching Apparatus>

Figure 13:
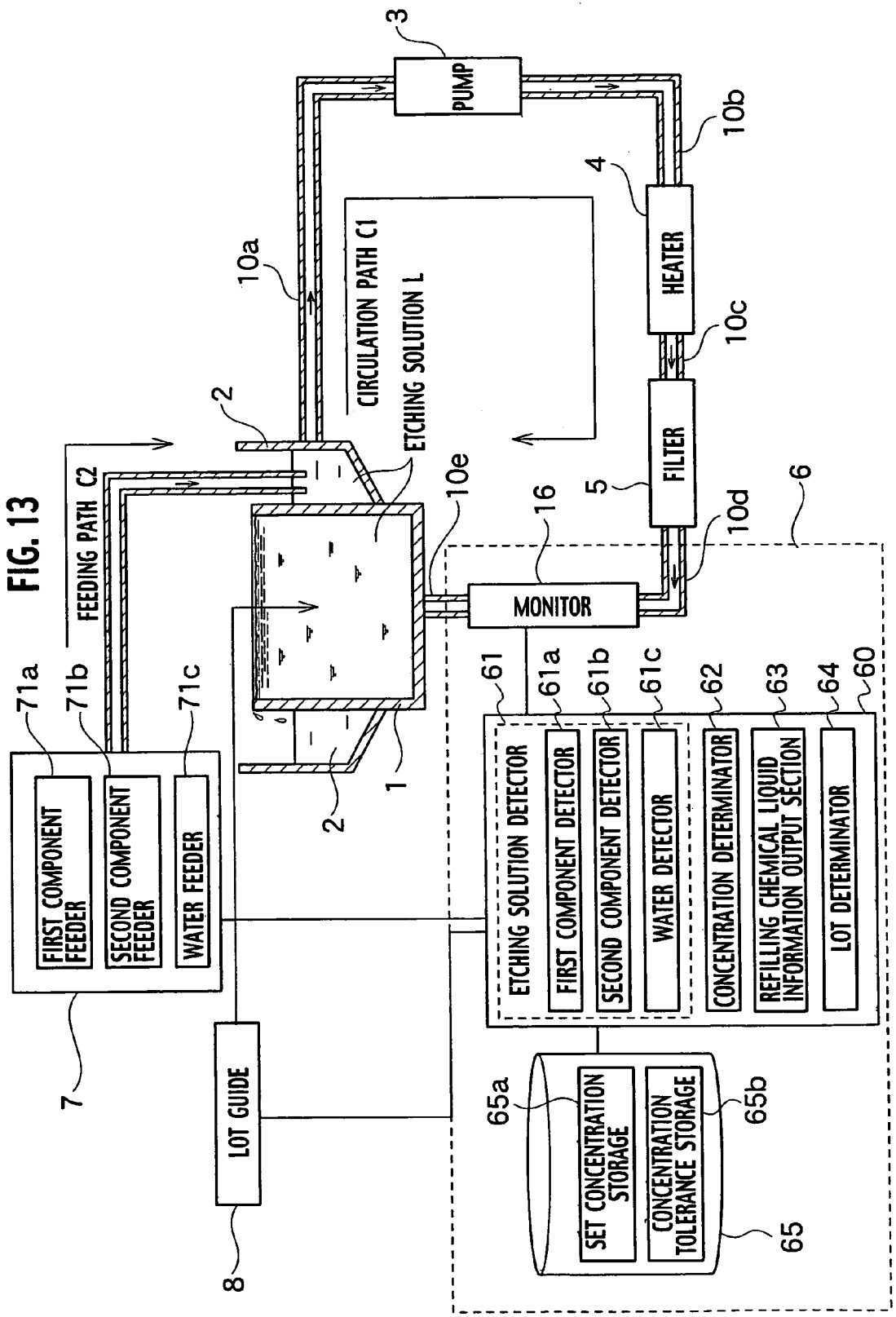
FIG. 13 is a block diagram showing an etching apparatus according to a second modification of the embodiment.

As shown in FIG. 13, an etching apparatus according to the second modification of the embodiment of the present invention is different from the etching apparatus shown in FIG. 1 in that the CPU 60 further includes a lot determinator 64. The lot determinator 64 determines whether or not there is a lot to be treated in the lot guide 8 connected to the CPU 60. Based of the resulting determination by the lot determinator 64, the etching solution detector 61 detects the concentration of the etching solution L monitored by the monitoring section 16. Based on a result of detection by the etching solution detector 61, the concentration determinator 62 determines whether or not the detection result satisfies the concentration tolerance. On the other hand, when there is no lot in the lot guide 8, the etching solution detector 61 does not detect the concentration of the etching solution L.

According to the etching apparatus shown in FIG. 12, the etching solution L is fed by the refilling chemical liquid feeder 7 only when there is a lot in the lot guide 8. Since the concentration of the etching solution L is controlled only when the etching treatment is required, it is possible to provide an etching apparatus capable of reducing the amount of refilling chemical liquids to be used.

<Method of Controlling an Etching Solution>

Figure 14:
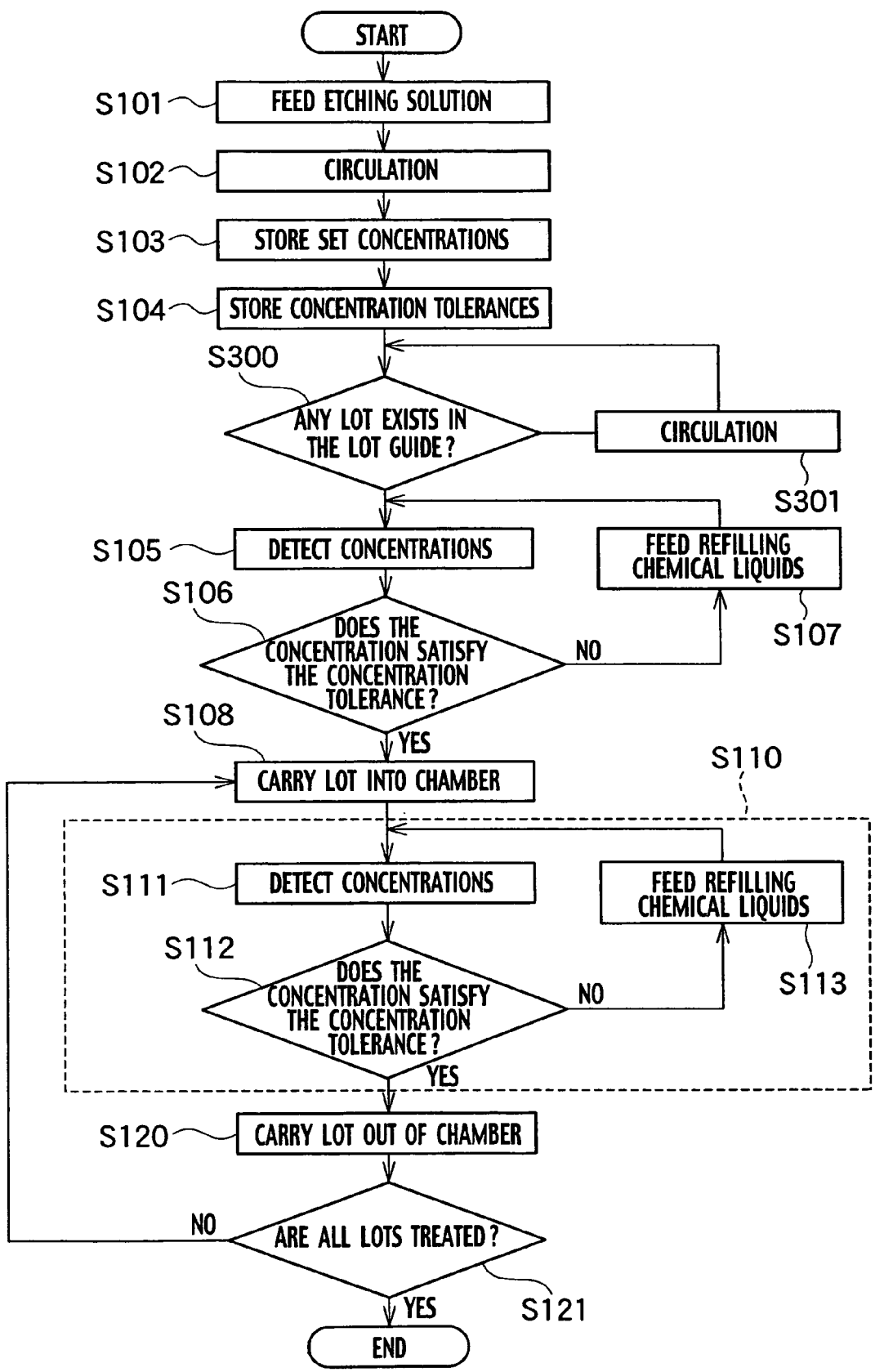
FIG. 14 is a flowchart showing a method of controlling an etching solution according to the second modification of the embodiment.

Next, description is provided regarding a method of controlling an etching solution using the etching apparatus according to the second modification of the embodiment, with reference to the flowchart shown in FIG. 14. Procedures shown in steps S101 to S104 and steps S105 to S121 are the same as those of the etching solution control method shown in FIG. 10, and description thereof is thus omitted. Further, FIG. 12 shows an example in which the concentration of the etching solution L is controlled while a lot is immersed in the treatment chamber 1 in step S110. However, the concentration of the etching solution L in the treatment chamber 1 may be non-uniform by feeding a refilling chemical liquid. Thus, as shown in FIG. 9, a chemical liquid may not be added while a lot is immersed.

In step S300 in FIG. 14, the lot determinator 64 determines whether or not there is a lot to be treated in the lot guide 8. When there is a lot to be treated, in step S105, the first component detector 61a, the second component detector 61b, and the water detector 61c respectively detect the concentrations of the first component, the second component, and water in the etching solution L supplied to the circulation path C1. On the other hand, when there is no lot to be treated, in step S301, the concentration of the etching solution L is not detected, and the circulation of the etching solution L is continued.

According to the etching solution control method of the second modification of the embodiment, the refilling chemical liquid feeder 7 feeds the refilling chemical liquid of the etching solution L based upon the determination of the lot determinator 64, the refilling chemical liquid is fed only in the case of etching treatment. Therefore, the amount of the refilling chemical liquid may be reduced compared to the case where the lot determinator 64 is not installed.

OTHER EMBODIMENTS

Various modifications will become possible for those skilled in the art upon receiving the teachings of the present disclosure without departing from the scope thereof. For, example, in the embodiment of the present invention, an ammonium fluoride/sulfuric acid/water based ($HH_4F/H_2SO_4/H_2O$ based) solution can be also used as the etching solution L in addition to the $HF/H_2SO_4/H_2O$ based solution.

What is claimed is:

1. An etching apparatus comprising:
   a chamber containing an etching solution including a first component, a second component, and water, a concentration of the water in the etching solution is at a specified level or lower;
   a circulation path configured to circulate the etching solution;
   a concentration controller configured to sample the etching solution from the circulation path and control concentrations of the first and second components and water respectively;
   a refilling chemical liquid feeder configured to feed a refilling chemical liquid including the first component having a concentration higher than the first component in the etching solution;
   a lot guide connected to the concentration controller and configured to guide a lot including a plurality of wafers, each of the wafers having a thin film on a surface, into the etching solution; and
   a lot determinator configured to determine whether the lot exists in the lot guide, wherein the concentration controller detects concentrations based on a determination of the lot determinator.

2. The etching apparatus of claim 1, wherein the first component is a sulfuric acid and the second component is a hydrogen fluoride and the concentration of water is 4 wt % or lower.

3. The etching apparatus of claim 1, wherein the concentration controller controls the concentrations of the first and second components and water so that the selective etching ratio of borosilicate glass film and silicon oxide film is 100 or higher.

4. The etching apparatus of claim 1, wherein the concentration controller controls the concentration of water between 2 wt % and 4 wt %.

5. The etching apparatus of claim 1, wherein the concentration controller controls the concentration of water between 3.00 wt %+/−0.03 wt %.

6. The etching apparatus of claim 1, wherein the concentration controller controls the concentration of hydrogen fluoride between 0.5 wt % and 2.0 wt %.

7. The etching apparatus of claim 1, wherein the concentration controller further comprises:
   a monitoring section configured to monitor the concentrations of the first and second components and water;
   an etching solution detector configured to detect the concentrations of the first and second components and water;

a concentration determinator configured to determine whether the concentrations of the first and second components and water satisfy concentration tolerances; and a refilling chemical liquid information output section configured to output a refilling chemical liquid information to feed the refilling chemical liquid to the chamber based on the determination of the concentration determinator.

8. The etching apparatus of claim 7, wherein the monitoring section further includes;

a first component monitor configured to monitor the concentration of the first component;

a second component monitor configured to monitor concentration of the second component; and a water monitor configured to monitor the concentration of the water.

* * * * *